(12) United States Patent
Chiolino et al.

(10) Patent No.: US 11,723,154 B1
(45) Date of Patent: Aug. 8, 2023

(54) MULTIWIRE PLATE-ENCLOSED BALL-ISOLATED SINGLE-SUBSTRATE SILICON-CARBIDE-DIE PACKAGE

(71) Applicants: Nicholas J. Chiolino, Springdale, AR (US); A. Matthew Francis, Elkins, AR (US); Matthew W. Barlow, Springdale, AR (US); Jacob Kupernik, Bella Vista, AR (US)

(72) Inventors: Nicholas J. Chiolino, Springdale, AR (US); A. Matthew Francis, Elkins, AR (US); Matthew W. Barlow, Springdale, AR (US); Jacob Kupernik, Bella Vista, AR (US)

( * ) Notice: Subject to any disclaimer, the term of this patent is extended or adjusted under 35 U.S.C. 154(b) by 258 days.

(21) Appl. No.: 17/176,338

(22) Filed: Feb. 16, 2021

Related U.S. Application Data

(60) Provisional application No. 62/977,585, filed on Feb. 17, 2020.

(51) Int. Cl.
| | |
|---|---|
| *H05K 3/32* | (2006.01) |
| *H01L 21/60* | (2006.01) |
| *H05K 1/11* | (2006.01) |
| *H01L 23/12* | (2006.01) |

(52) U.S. Cl.
CPC ............ *H05K 3/325* (2013.01); *H01L 21/60* (2021.08); *H01L 23/12* (2013.01); *H05K 1/111* (2013.01)

(58) Field of Classification Search
None
See application file for complete search history.

(56) References Cited

U.S. PATENT DOCUMENTS

| | | | | |
|---|---|---|---|---|
| 3,624,587 A | * | 11/1971 | Conrad ................ | H01R 12/718 439/325 |
| 5,074,799 A | * | 12/1991 | Rowlette, Sr. ..... | H01R 12/7076 439/91 |
| 5,123,849 A | * | 6/1992 | Deak .................... | H01R 12/714 439/91 |
| 5,129,833 A | * | 7/1992 | Rowlette, Sr. ....... | H05K 7/1061 439/91 |
| 5,473,510 A | * | 12/1995 | Dozier, II .......... | H01L 23/4006 439/91 |
| 5,477,086 A | * | 12/1995 | Rostoker ................ | H01L 24/12 439/246 |
| 5,691,041 A | * | 11/1997 | Frankeny ............... | H01R 12/52 428/209 |

(Continued)

FOREIGN PATENT DOCUMENTS

| | | | | |
|---|---|---|---|---|
| CN | 1176505 A | * | 3/1998 | .......... G01R 1/0483 |
| CN | 1202730 A | * | 12/1998 | .......... G01R 1/0483 |

(Continued)

*Primary Examiner* — Timothy J. Dole
*Assistant Examiner* — Muhammed Azam
(74) *Attorney, Agent, or Firm* — Keisling & Pieper PLC; David B. Pieper; Trent C. Keisling

(57) ABSTRACT

A silicon carbide die package with multiple wire access points utilizing top and bottom enclosure plate clamps housing a silicon carbide die on a printed wiring board with wire contact pads, and a set of set screws providing downward pressure from the top enclosure plate inside the center of a cylindrical isolation housing to an isolation ball positioned above a clamp discs to clamp a wire end between the clamp disc and the wire contact pad.

15 Claims, 5 Drawing Sheets

(56) References Cited

U.S. PATENT DOCUMENTS

| | | | | |
|---|---|---|---|---|
| 5,738,531 A * | 4/1998 | Beaman | H01L 23/49827 | 439/71 |
| 5,767,580 A * | 6/1998 | Rostoker | H05K 1/111 | 257/737 |
| 5,778,523 A | 7/1998 | Sylvester | 29/831 | |
| 5,779,488 A * | 7/1998 | Cluff | H05K 7/1023 | 439/73 |
| 5,888,630 A | 3/1999 | Sylvester et al. | 428/212 | |
| 5,892,245 A * | 4/1999 | Hilton | H05K 7/1061 | 257/727 |
| 5,900,312 A | 5/1999 | Sylvester | 428/322.7 | |
| 5,905,638 A * | 5/1999 | MacDonald, Jr. | H01R 13/2414 | 361/767 |
| 5,919,050 A * | 7/1999 | Kehley | H01R 12/716 | 439/526 |
| 5,940,278 A * | 8/1999 | Schumacher | G01R 1/07378 | 361/767 |
| 5,977,489 A * | 11/1999 | Crotzer | H01R 12/52 | 361/767 |
| 6,014,317 A | 1/2000 | Sylvester | 361/760 | |
| 6,015,722 A | 1/2000 | Banks et al. | 438/108 | |
| 6,078,500 A * | 6/2000 | Beaman | H01L 23/32 | 29/850 |
| 6,109,930 A * | 8/2000 | Koschmeder | H05K 3/325 | 439/74 |
| 6,114,757 A * | 9/2000 | DelPrete | H01L 23/32 | 439/71 |
| 6,127,250 A | 10/2000 | Sylvester et al. | 438/584 | |
| 6,325,552 B1 * | 12/2001 | Brillhart | H05K 7/1061 | 385/88 |
| 6,344,684 B1 * | 2/2002 | Hussain | H01L 23/50 | 257/E23.079 |
| 6,354,844 B1 * | 3/2002 | Coico | H05K 3/325 | 439/74 |
| 6,362,516 B1 * | 3/2002 | Waters | H01L 25/105 | 174/16.3 |
| 6,381,164 B1 * | 4/2002 | Fan | G11C 5/063 | 361/769 |
| 6,386,890 B1 * | 5/2002 | Bhatt | H05K 3/325 | 439/67 |
| 6,392,899 B1 * | 5/2002 | Harrison | G06F 1/189 | 361/768 |
| 6,443,739 B1 * | 9/2002 | Currie | H05K 3/225 | 439/55 |
| 6,475,011 B1 * | 11/2002 | Sinha | H05K 3/325 | 439/330 |
| 6,477,058 B1 * | 11/2002 | Luebs | H05K 7/1061 | 361/764 |
| 6,490,161 B1 * | 12/2002 | Johnson | H01L 23/433 | 257/E23.09 |
| 7,157,744 B2 | 1/2007 | Palmteer et al. | 257/98 | |
| 7,729,121 B1 * | 6/2010 | Deshpande | H01L 23/40 | 257/727 |
| 7,806,994 B2 | 10/2010 | Smith et al. | 148/400 | |
| 8,331,094 B2 | 12/2012 | Ankireddi et al. | 361/721 | |
| 8,927,345 B2 | 1/2015 | Yap et al. | 438/127 | |
| 10,321,555 B1 * | 6/2019 | Trulli | H05K 1/141 | |
| 10,518,387 B2 | 12/2019 | Mao et al. | | |
| 2002/0016091 A1 * | 2/2002 | Perino | H05K 7/1431 | 439/73 |
| 2002/0030972 A1 * | 3/2002 | Ali | F28D 15/0233 | 257/E23.084 |
| 2002/0036341 A1 * | 3/2002 | Uzuka | H01L 23/4006 | 257/E23.084 |
| 2002/0042214 A1 * | 4/2002 | Harrison | H05K 7/1092 | 29/830 |
| 2002/0070448 A1 * | 6/2002 | Gonzalez | H01L 23/4006 | 257/E23.084 |
| 2002/0137367 A1 * | 9/2002 | Torok | H01R 13/2421 | 439/73 |
| 2003/0020179 A1 * | 1/2003 | D'Amato | H01L 21/4853 | 257/784 |
| 2003/0036301 A1 * | 2/2003 | Colbert | H05K 3/325 | 439/331 |
| 2003/0051338 A1 * | 3/2003 | Buley | H05K 7/1061 | 29/830 |
| 2003/0058624 A1 * | 3/2003 | Deeney | H05K 3/325 | 361/736 |
| 2003/0073330 A1 * | 4/2003 | Petit | H05K 7/023 | 439/69 |
| 2003/0089523 A1 * | 5/2003 | Hoffmeyer | H05K 7/1061 | 174/261 |
| 2003/0224558 A1 * | 12/2003 | Cromwell | H01L 23/4006 | 438/455 |
| 2003/0234451 A1 * | 12/2003 | Razon | H01L 24/48 | 257/E23.068 |
| 2004/0000428 A1 * | 1/2004 | Lii | H01L 23/49816 | 257/772 |
| 2005/0048807 A1 * | 3/2005 | Li | H01L 23/49811 | 257/E23.068 |
| 2007/0072450 A1 * | 3/2007 | McAllister | H05K 3/325 | 439/73 |
| 2007/0224845 A1 * | 9/2007 | Becker | H01L 23/3675 | 257/E23.087 |
| 2008/0009152 A1 * | 1/2008 | Colbert | H01L 23/4006 | 257/E23.084 |
| 2008/0054430 A1 * | 3/2008 | Coteus | H05K 3/325 | 257/686 |
| 2008/0068817 A1 * | 3/2008 | Morita | H01L 23/433 | 361/767 |
| 2012/0262875 A1 * | 10/2012 | Johnson | G11C 5/04 | 361/679.02 |
| 2015/0022986 A1 * | 1/2015 | Steuer | H05K 5/0017 | 361/767 |
| 2015/0333022 A1 * | 11/2015 | Albers | H01L 24/16 | 257/737 |
| 2016/0093966 A1 * | 3/2016 | Behziz | H05K 1/117 | 439/607.28 |
| 2019/0304886 A1 * | 10/2019 | Leuten | H05K 1/111 | |
| 2022/0272880 A1 * | 8/2022 | Chauhan | H05K 1/181 | |

FOREIGN PATENT DOCUMENTS

| | | | | |
|---|---|---|---|---|
| CN | 1526183 A | * | 9/2004 | H01R 12/613 |
| CN | 101055857 A | * | 10/2007 | H01L 21/76898 |
| CN | 105720015 A | * | 6/2016 | G11C 5/04 |
| CN | 112104200 A | * | 12/2020 | H01F 27/263 |
| DE | 19814164 A1 | * | 10/1998 | G01R 1/0483 |
| EP | 1175134 A1 | * | 1/2002 | F28D 15/0233 |
| JP | 2008515203 A | * | 5/2008 | |
| KR | 20000045980 A | * | 7/2000 | |
| KR | 20030009769 A | * | 2/2003 | |
| KR | 20050031944 A | * | 4/2005 | |
| KR | 20050041955 A | * | 5/2005 | |
| KR | 20080027158 A | * | 3/2008 | |
| KR | 20080046120 A | * | 5/2008 | |
| KR | 100855887 B1 | * | 9/2008 | |
| KR | 20100024429 A | * | 3/2010 | |
| WO | WO-0217438 A1 | * | 2/2002 | G11C 5/063 |
| WO | WO-02065592 A1 | * | 8/2002 | H01R 12/7041 |
| WO | WO-2017135257 A1 | * | 8/2017 | H01L 21/52 |

\* cited by examiner

MULTIWIRE PLATE-ENCLOSED BALL-ISOLATED SINGLE-SUBSTRATE SILICON-CARBIDE-DIE PACKAGE

CROSS-REFERENCE TO RELATED APPLICATIONS

This application claims priority to and is a continuation-in-part of U.S. Patent Application Ser. No. 62/977,585, filed on Feb. 17, 2020 entitled Multiwire Plate-Enclosed Ball-Isolated Single-Substrate Silicon-Carbide-Die Package which is hereby incorporated by reference in its entirety.

STATEMENT REGARDING FEDERALLY SPONSORED RESEARCH OR DEVELOPMENT

This invention was made with government support by Extreme Environment System Integration Techniques for Venus In-Situ Processing NASA SBIR Phase I Contract Number: 80NSSC19C0348 Contract Period: Sep. 18,2019-Feb. 18, 2020. The government has certain rights in the invention.

REFERENCE TO A MICROFICHE APPENDIX

Not Applicable.

RESERVATION OF RIGHTS

A portion of the disclosure of this patent document contains material which is subject to intellectual property rights such as but not limited to copyright, trademark, and/or trade dress protection. The owner has no objection to the facsimile reproduction by anyone of the patent document or the patent disclosure as it appears in the Patent and Trademark Office patent files or records but otherwise reserves all rights whatsoever.

BACKGROUND OF THE INVENTION

1. Field of the Invention

The present invention relates to improvements in silicon carbide die packages. More particularly, the invention relates to improvements particularly suited for providing multiple wire connections to multiple die in a lightweight robust package. In particular, the present invention relates specifically to a Multiwire Plate-Enclosed Ball-Isolated Single-Substrate Silicon-Carbide-Die Package.

2. Description of the Known Art

As will be appreciated by those skilled in the art, die packages are known in various forms. Patents disclosing information relevant to die packages include: U.S. Pat. No. 10,518,387, issued to Mao, et al. on Dec. 31, 2019 entitled Grinding element, grinding wheel and manufacturing method of semiconductor package using the same; U.S. Pat. No. 8,927,345, issued to Yap, et al. on Jan. 6, 2015 entitled Device package with rigid interconnect structure connecting die and substrate and method thereof; U.S. Pat. No. 8,331,094, issued to Ankireddi, et al. on Dec. 11, 2012 entitled Thermal and power bus stacked package architecture; U.S. Pat. No. 7,806,994, issued to Smith, et al. on Oct. 5, 2010 entitled Electronic package formed using low-temperature active solder including indium, bismuth, and/or cadmium; U.S. Pat. No. 7,157,744, issued to Palmteer, et al. on Jan. 2, 2007 entitled Surface mount package for a high power light emitting diode; U.S. Pat. No. 6,127,250, issued to Sylvester, et al. on Oct. 3, 2000 entitled Method of increasing package reliability by designing in plane CTE gradients; U.S. Pat. No. 6,015,722, issued to Banks, et al. on Jan. 18, 2000 entitled Method for assembling an integrated circuit chip package having an underfill material between a chip and a substrate; U.S. Pat. No. 6,014,317, issued to Sylvester Jan. 11, 2000 entitled Chip package mounting structure for controlling warp of electronic assemblies due to thermal expansion effects; U.S. Pat. No. 5,900,312, issued to Sylvester May 4, 1999 entitled Integrated circuit chip package assembly; U.S. Pat. No. 5,888,630, issued to Sylvester, et al. on Mar. 30, 1999 entitled Apparatus and method for unit area composition control to minimize warp in an integrated circuit chip package assembly; and U.S. Pat. No. 5,778,523, issued to Sylvester Jul. 14, 1998 entitled Method for controlling warp of electronic assemblies by use of package stiffener. Each of these patents is hereby expressly incorporated by reference in their entirety.

From these prior references it may be seen that these prior art patents are very limited in their teaching and utilization, and an improved die package is needed to overcome these limitations.

SUMMARY OF THE INVENTION

The present invention is directed to an improved electronic die package. In accordance with one exemplary embodiment of the present invention, a die package is provided providing multiple wire access points utilizing a plate clamp enclosed, ball isolated, single substrate for silicon carbide die operation.

An electrical circuit packaging apparatus is provided for connecting a wire end to a package die in a manner that can survive space travel. The electrical circuit packaging apparatus uses an enclosure top plate connected to an enclosure bottom plate with a wiring board captured between the enclosure top plate and the enclosure bottom plate. The wiring board includes a wire contact pad and the enclosure top plate has an adjustable clamping pressure extension, a set screw in the preferred embodiment, connected to the enclosure top plate. The adjustable clamping pressure extension includes a lower pressure end in a vertical arrangement with an isolation ball contacting the pressure end and a clamp disc contacting the isolation ball opposite the pressure end and above the wire contact pad to provide electrical and physical clamping forces to the wire end clamped between the clamp disc and the wire contact pad. A cylindrical insulating guidance housing positioned above the wire contact pad uses an outer housing wall defining a vertical through aperture to accept and retain the pressure end, isolation ball, and clamp disc, the insulating guidance housing. The housing body has a side wire aperture to position the wire end between the wire contact pad and the clamp disc.

In an alternative embodiments, the isolation ball can be removed by changing the clamp disc to an insulating ceramic and giving sufficient isolation depth to the clamp disc, but this loses the pressure centering advantage of the isolation ball. Simply put, wherever the pressure end contacts the upper surface of the isolation ball, the ball being centered by the guidance housing centers the clamping force for the wire contact pad.

In another alternative embodiment, the clamp disc can be removed by giving sufficient isolation depth to the isolation ball but this loses the broad surface area for clamping provided by the clamping disc. Simply put, the wire will likely be forced against the side wire aperture which puts a sideways force on the cylindrical insulating ceramic housing.

These and other objects and advantages of the present invention, along with features of novelty appurtenant thereto, will appear or become apparent by reviewing the following detailed description of the invention.

BRIEF DESCRIPTION OF THE SEVERAL VIEWS OF THE DRAWINGS

In the following drawings, which form a part of the specification and which are to be construed in conjunction therewith, and in which like reference numerals have been employed throughout wherever possible to indicate like parts in the various views.

DETAILED DESCRIPTION OF THE INVENTION

As shown in FIGS. 1 through 5 of the drawings, one exemplary embodiment of the present invention is generally shown as a packaging apparatus 100 and method utilizing intelligent material choices to create a relatively dense but modular assembly and connection method for silicon carbide (SiC) die. This packaging advancement was driven by the need to heterogeneously integrate several SiC die onto a single substrate for a multi-chip design using a microprocessor as a vehicle to illustrate the technology. In this effort, the fabrication and packaging strategy greatly reduced the weight and increased the total area and input/output pins (I/O) of previous designs.

In a previous NASA Phase I project (Motor Actuation Phase I Co. No. 80NSSC18P2089). Ozark IC developed a chip on board packaging solution for testing JFET-R SiC die at >500° C. temperatures. This package, although providing a solution at the time, was large, heavy, and I/O limited.

To achieve the goal of creating a multi-chip microprocessor in a single package, this first design had to be re-invented. The design had to be smaller in area, lighter, and achieve a higher density of I/O. To tackle these new requirements, a mixed metal-ceramic package was designed. This new design utilizes advancements in ceramic 3D printing, metal laser cutting, and post-fire conductive paste printing.

Figure 1:
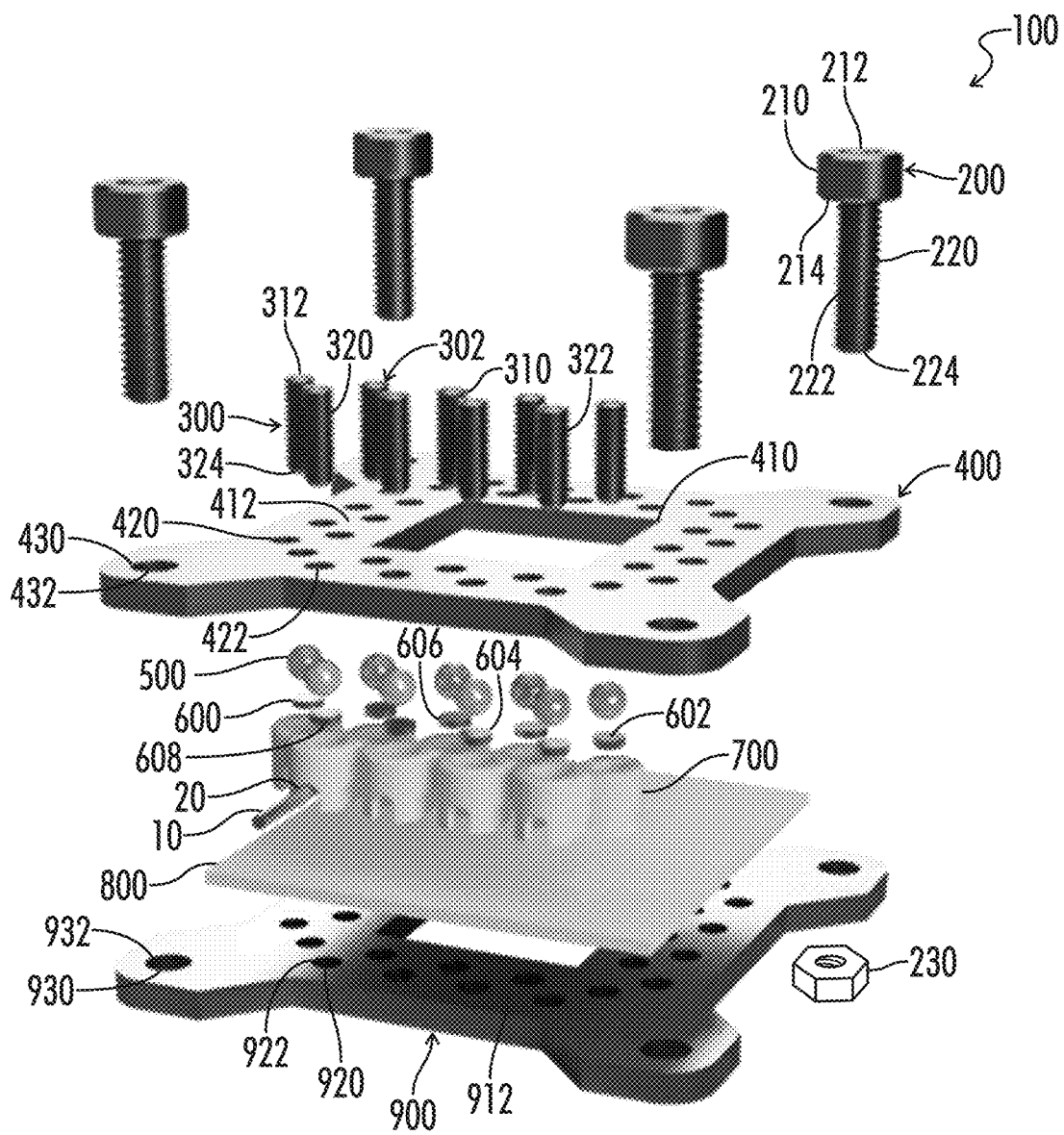
FIG. 1 in an exploded view of the package.

The basic elements of the new design can be seen in FIG. 1 and the relationship of the different materials can be understood. The enclosure posts 200 are made from 316 stainless steel, the adjustable clamping pressure extensions 300 shown as wire set screws 302 are made from 316 stainless steel, the enclosure top plate 400 is made from grade 2 titanium, the input/output isolation balls 500 are made from silicon nitride, the clamp discs 600 are made from 316 stainless steel, the ceramic input/output insulating guidance housing 700 is made from vitrolite ceramic, the printed wiring board (PWB) 800 is made from alumina, and the enclosure bottom plate 900 made from Grade 2 titanium. This material relationship was chosen for structural properties in high vibration, high physical force environments such as launching of a space craft that is also capable of high temperature space environments to provide a thermally stable clamping connection. We can look at each element in detail to understand the construction.

The enclosure posts 200 include a post head 210 connected to a post shank 220. The post head 210 defines a post driving recess 212 shown as a typical hex recess and a post extending shoulder 214 that stops against the enclosure top plate 400 to limit travel. The post shank 220 defines post threads 222 down to the post foot end 224. The post foot end 224 inserts through the top clamping apertures 430 and then down into and/or through the bottom clamping apertures 930. The post foot end 224 can extend far enough past the bottom clamping apertures 930 to be secured with a threaded nut 230 that is larger than the bottom clamping aperture 930. In addition to, or in replacement of the use of the nut 230 the post threads 222 can engage bottom aperture threads 932 in the bottom clamping apertures 930. Similarly, the post threads 222 can engage top clamping threads 432 in the top clamping apertures 430 to hold the packaging apparatus 100 together. If the nut 230 is used, the clamping apertures 430, 930 can also be built without threads such that the clamping apertures 430, 930 are larger than the post threads 222 or the post threads can be eliminated in the areas of the clamping apertures 430, 930 but the tolerances need to be controlled because they affect the relative movement of the enclosure plates 400, 900 that provide the base housing for the packaging apparatus 100.

The enclosure top plate 400 defines a top die aperture 410 with a top support area 412 defining top wire set apertures 420 and top clamping apertures 430. The top support area 412 withstands the constant clamping force. The top die aperture 410 is sized for electrical and thermal clearances for the die and electrical circuit being utilized. The top wire set apertures 420 include top set threads 422 to engage the clamp threads 322, and the top clamping apertures 430 can include top clamping threads 432 to position the enclosure posts 200.

The adjustable clamping pressure extension 300 is preferable made as wire set screws 302 that include a screw set shank 320 with an upper screw driving end 310 that defines a screw driving recess 312, and wire clamp threads 322 extending from the screw driving end 310 down to the screw pressure end 324. The wire clamp threads 322 engage the set threads 422 in the wire set apertures 420 to provide clamping pressure where the pressure end 324 contacts the isolation balls 500. When wire sizes are known and carefully controlled, the wire set apertures 420 can be simple indentions and a simple elongated bar with a pressure end 324 could be positioned in the indention between enclosure top plate 400 and the isolation balls 500 or the enclosure top plate could be manufactured with the extensions as part of the top plate itself. However, in this preferred embodiment, the adjustability of using set screws 310 was preferred.

The spherical input/output isolation balls 500 are sized to slide within the ceramic input/output insulating guidance housing 700 between the pressure end 324 and the clamp discs 600. Due to the ball shape, the isolation balls 500 transfer the force from the pressure end 324 to the center of the clamp discs 600. With this construction, some variation in the location of the pressure end 324 in relationship to the clamp disc 600 can be tolerated because the balls 500 always apply pressure to the center of the clamp discs 600 even when the pressure end 324 is off center in the ceramic input/output insulating guidance housing 700. In this manner differences in the coefficient or rate of thermal expansion in the materials, vibrational or force bending movements of the components, or simply manufacturing variances can be tolerated in the packaging apparatus 100.

The cylindrical clamp discs 600 are-also sized to slide within the ceramic input/output insulating guidance housing 700 and are positioned the isolation balls 500 and the wire end 20. The clamp discs 600 include a clamp top 602, cylindrical clamp body 604 with body side 606, and clamp bottom 608.

The ceramic input/output insulating guidance housing 700 includes a housing body 702 with an outer housing wall 704 defining a central aperture 706 extending from a housing top 708 to a housing bottom 710. The housing body 702 is vertically captured between the enclosure top plate 400 and the printed wiring board 800. The housing body 702 is horizontally retained in position by the insertion of the clamping pressure extensions 300 shown as wire set screw 310 into the top of the central aperture 706 where the wire set screw 310 is threadably engaged with the set threads 422 in the enclosure top plate 400. In this manner, the ceramic input/output insulating guidance housing 700 physically and electrically isolates the primed wiring board 800 from the enclosure top plate 400 and also individually isolates the pressure ends 324, isolation balls, and clamping discs 600 from each other to ensure adequate creep and other voltage isolation distances. The housing body 702 defines a pair of opposed side wire apertures 712 at the housing bottom 710 for insertion of the wire end 20 between the printed wiring board 800 and the clamping disc 600 on the outside edge and to allow for the extending traces 804 to escape toward the die mount area 802 on the inside edge.

The printed wiring board (PWB) 800 has a die mount area 802, extending traces 804, and wire contact pads 806 positioned in vertical association with the wire set apertures 420 to provide the electrical contacts into and out of the silicon carbide high temperature package die 30.

The enclosure bottom plate 900 defines a bottom die aperture 910 with a bottom support area 912 defining bottom wire set apertures 920, and bottom clamping apertures 930. The bottom support area 912 supports the printed wiring board 800 and opposes the constant clamping force from the adjustable clamping pressure extension 300. The bottom die aperture 910 is also sized for electrical and thermal clearances for the package die 30 and electrical circuit being utilized. The bottom wire set apertures 920 include bottom set threads 922 to engage the clamp threads 322 if a clamp is desired on the bottom of the package, and the bottom clamping apertures 930 can include bottom clamping threads 932 to position the enclosure posts 200.

The operating principle for this all-in-one package and connector is to provide a small but modular packaging apparatus 100 that will survive Venus temperatures. This is achieved by using a selection of materials that have demonstrated over 1000 hours of operation at >500° C. These materials can be seen in FIG. 1. The Titanium housing 110 including the enclosure top plate 400 and the enclosure bottom plate 900 provides a mechanical support to house the entire packaging apparatus 100. It should be noted that it does not provide electrical connectivity in this design although some shielding effects may be realized. The 2 mm stainless steel set screws 302 that correspond to each I/O contact pad 806 of the PWB 800 also provide only a mechanical clamping force onto the wire end 20. The conductive path connecting the wire end 20 to the PWB 806 is isolated from these metal components with Silicon Nitride balls 500 and 3D printed ceramic housings 700. Altogether, this packaging apparatus 100 was successfully fabricated and assembled. This can be seen in FIG. 2.

Figure 2:
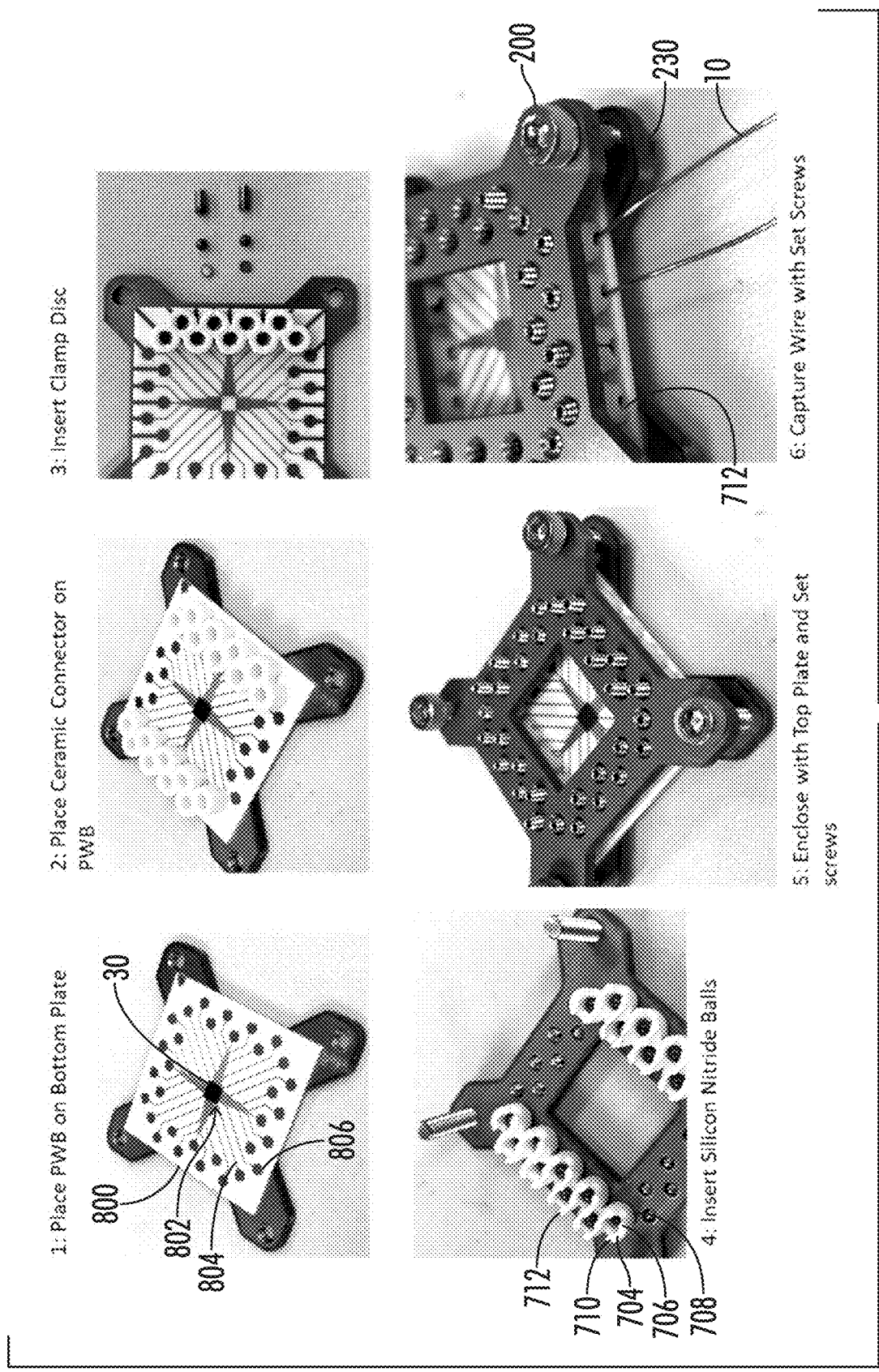
FIG. 2 shows the steps for assembling the high-density High-temperature package and connector.
Figure 3:
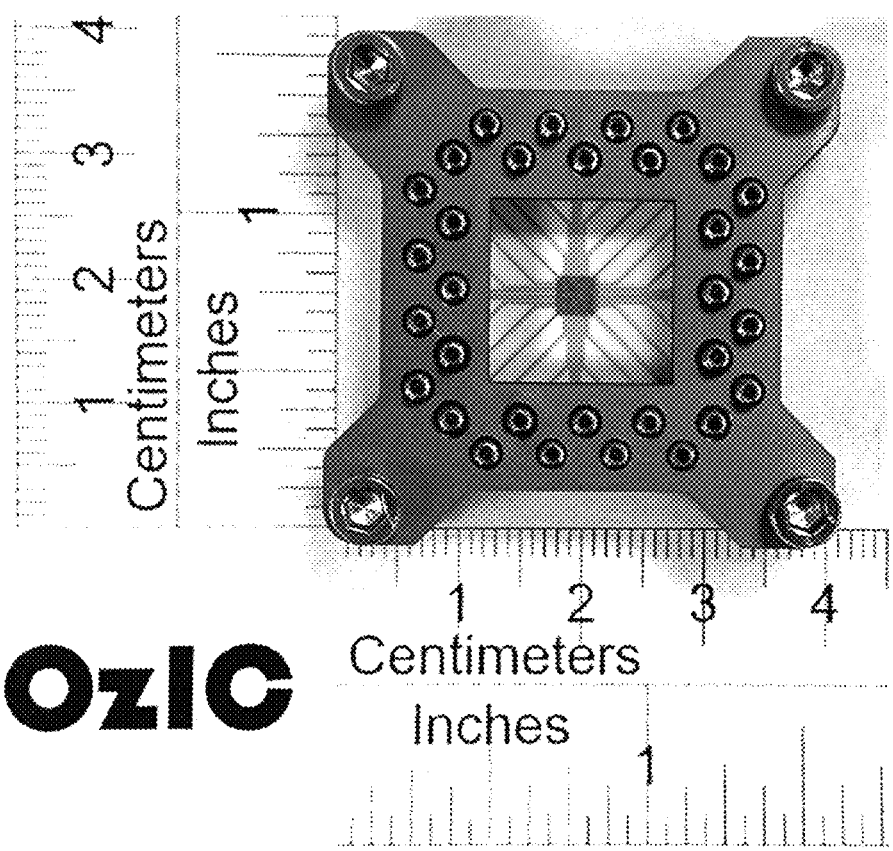
FIG. 3 shows a scaled image of the package.
Figure 4:
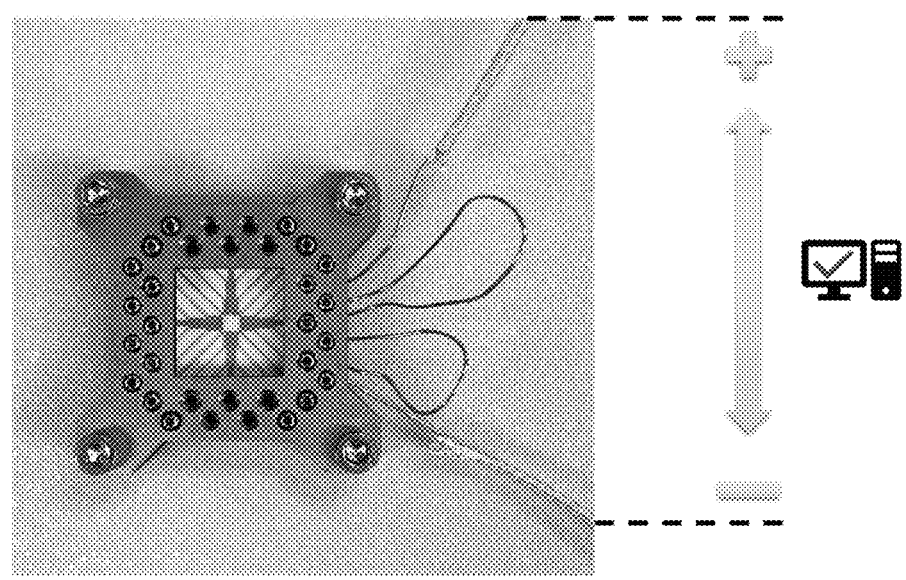
FIG. 4 shows the wire connections and package escapement method.
Figure 5:
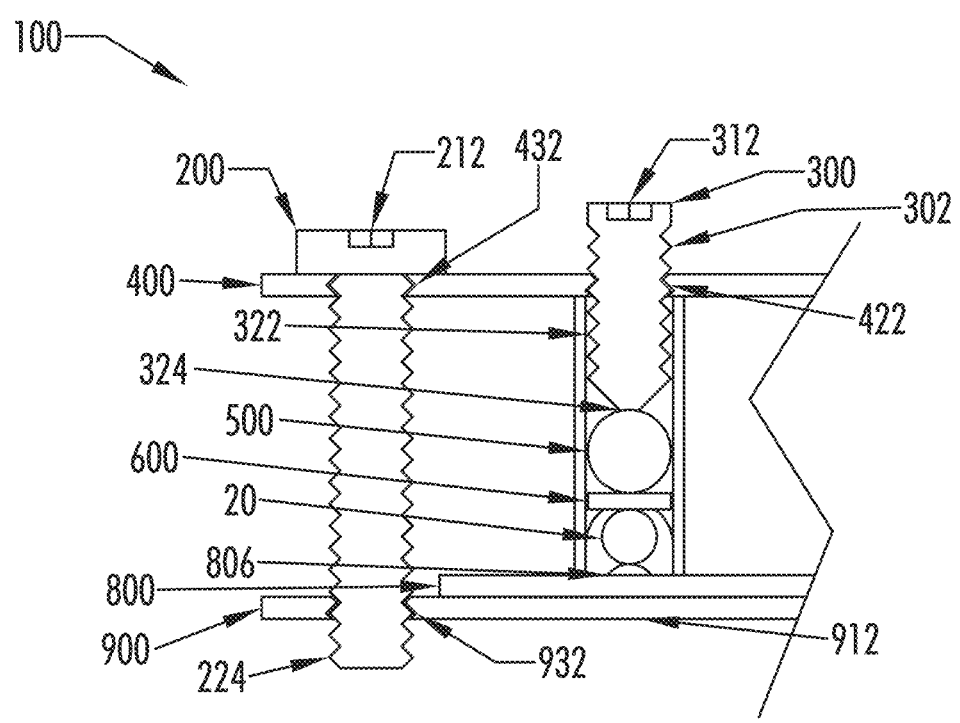
FIG. 5 shows a cutaway view of the wire connections.

FIG. 2 show the assembly process for the High-density High-temperature package and connector packaging apparatus 100. First, place the PWB 800 on the bottom plate 900, next place the ceramic connector insulating guidance housing 700 on the PWB 800, third, insert the clamp disc 600, fourth insert the silicon nitride balls 500, next enclose it with the top plate 400 and set screws 302, finally capture the connecting wires 10 with the set screws 302. A scaled image of the assembled packaging apparatus 100 can be seen in FIG. 3.

This packaging apparatus 100 integrates the ceramic connector/spacer 700 with the printed wiring board (PWB) 800 that contains the SiC package die 30. The wires 10 escape the package 100 from all four sides of this package 100. An example of this escapement for one side can be seen in FIG. 4.

This methodology can be designed to any PWB 800 size. The flexibility of ceramic 3D printing, additive paste dispensing, and laser cutting allows rapid prototyping of any packaging design.

Reference numerals used throughout the detailed description and the drawings correspond to the following elements:
wire 10
wire end 20
package die 30
packaging apparatus 100
enclosure posts 200
   post head 210
      post driving recess 212
      post extending shoulder 214
   post shank 220
      post threads 222
      post foot end 224
   threaded nut 230
enclosure top plate 400
   top die aperture 410
   top support area 412
   top wire set apertures 420
      top set threads 422
   top clamping apertures 430
      top clamping threads 432
adjustable clamping pressure extension 300
   wire set screws 302
   screw driving end 310
      screw driving recess 312
   set shank 320
      wire clamp threads 322
      pressure end 324
input/output isolation balls 500
clamp discs 600
   clamp top 602
   cylindrical clamp body 604
      body side 606
   clamp bottom 608
ceramic input/output insulating guidance housing 700
   housing body 702
      outer housing wall 704
      cylindrical central aperture 706
      housing top 708
      housing bottom 710
      side wire aperture 712
printed wiring board (PWB) 800
   die mount area 802
   extending traces 804
   wire contact pads 806
enclosure bottom plate 900
   bottom die aperture 910 bottom support area 912
bottom wire set apertures 920
  bottom set threads 922
bottom clamping apertures 930
  bottom clamping threads 932

From the foregoing, it will be seen that this invention well adapted to obtain all the ends and objects herein set forth, together with other advantages which are inherent to the structure. It will also be understood that certain features and subcombinations are of utility and may be employed without reference to other features and subcombinations. This is contemplated by and is within the scope of the claims. Many possible embodiments may be made of the invention without departing from the scope thereof. Therefore, it is to be understood that all matter herein set forth or shown in the accompanying drawings is to be interpreted as illustrative and not in a limiting sense.

When interpreting the claims of this application, method claims may be recognized by the explicit use of the word 'method' in the preamble of the claims and the use of the 'ing' tense of the active word. Method claims should not be interpreted to have particular steps in a particular order unless the claim element specifically refers to a previous element, a previous action, or the result of a previous action. Apparatus claims may be recognized by the use of the word 'apparatus' in the preamble of the claim and should not be interpreted to have 'means plus function language' unless the word 'means' is specifically used in the claim element. The words 'defining,' 'having,' or 'including' should be interpreted as open ended claim language that allows additional elements or structures. Finally, where the claims recite "a" or "a first" element of the equivalent thereof, such claims should he understood to include incorporation of one or more such elements, neither requiring nor excluding two or more such elements.

What is claimed is:

1. An electrical circuit packaging apparatus for connecting a wire with a wire end to a package die, the electrical circuit packaging apparatus comprising:
   an enclosure top plate connected to an enclosure bottom plate with a wiring board captured between the enclosure top plate and the enclosure bottom plate;
   the wiring board including a wire contact pad;
   an adjustable clamping pressure extension connected to the enclosure top plate, the adjustable clamping pressure extension including a pressure end;
   an isolation ball contacting the pressure end;
   a clamp disc contacting the isolation ball opposite the pressure end and above the wire contact pad; and
   an insulating guidance housing with a housing body including an outer housing wall defining a vertical through aperture sized to accept the pressure end, the isolation ball, and the clamp disc, the insulating guidance housing positioned above the wire contact pad;
   the housing body further defining a side wire aperture to position the wire end between the wire contact pad and the clamp disc.

2. The electrical circuit packaging apparatus of claim 1, further comprising:
   the enclosure bottom plate defining a bottom support area opposite the adjustable clamping pressure extension.

3. The electrical circuit packaging apparatus of claim 2, further comprising:
   the enclosure top plate defining a top wire set aperture and top set threads above the wire contact pad.

4. The electrical circuit packaging apparatus of claim 3, further comprising:
   the enclosure bottom plate defining a bottom support area opposite the top wire set aperture.

5. The electrical circuit packaging apparatus of claim 1, further comprising:
   the adjustable clamping pressure extension including a wire set screw threadably engaged with the enclosure top plate, the wire set screw including the pressure end.

6. An electrical circuit packaging apparatus for connecting a wire with a wire end to a package die, the electrical circuit packaging apparatus comprising:
   an enclosure top plate connected to an enclosure bottom plate with a wiring board captured between the enclosure top plate and the enclosure bottom plate;
   the wiring board including a wire contact pad;
   an adjustable clamping pressure extension connected to the enclosure top plate, the adjustable clamping pressure extension including a pressure end;
   an isolation ball contacting the pressure end;
   an insulating guidance housing with a housing body including an outer housing wall defining a vertical through aperture sized to accept the pressure end and the isolation ball, the insulating guidance housing positioned above the wire contact pad;
   the housing body further defining a side wire aperture to position the wire end between the wire contact pad and the isolation ball.

7. The electrical circuit packaging apparatus of claim 6, further comprising:
   the enclosure bottom plate defining a bottom support area opposite the adjustable clamping pressure extension.

8. The electrical circuit packaging apparatus of claim 6, further comprising: the adjustable clamping pressure extension including a wire set screw threadably engaged with the enclosure top plate, the wire set screw including the pressure end.

9. The electrical circuit packaging apparatus of claim 7, further comprising:
   the enclosure top plate defining a top wire set aperture and top set threads above the wire contact pad.

10. The electrical circuit packaging apparatus of claim 9, further comprising:
    the enclosure bottom plate defining a bottom support area opposite the top wire set aperture.

11. An electrical circuit packaging apparatus for connecting a wire with a wire end to a package die, the electrical circuit packaging apparatus comprising:
    an enclosure top plate connected to an enclosure bottom plate with a wiring board captured between the enclosure top plate and the enclosure bottom plate;
    the wiring board including a wire contact pad;
    an adjustable clamping pressure extension connected to the enclosure top plate, the adjustable clamping pressure extension including a pressure end;
    a clamp disc contacting the pressure end;
    an insulating guidance housing with a housing body including an outer housing wall defining a vertical through aperture sized to accept the pressure end and the clamp disc, the insulating guidance housing positioned above the wire contact pad;
    the housing body further defining a side wire aperture to position the wire end between the wire contact pad and the clamp disc.

12. The electrical circuit packaging apparatus of claim 11, further comprising:
    the enclosure bottom plate defining a bottom support area opposite the adjustable clamping pressure extension.

13. The electrical circuit packaging apparatus of claim 12, further comprising:
   the enclosure top plate defining a top wire set aperture and top set threads above the wire contact pad.

14. The electrical circuit packaging apparatus of claim 13, further comprising:
   the enclosure bottom plate defining a bottom support area opposite the top wire set aperture.

15. The electrical circuit packaging apparatus of claim 11, further comprising: the adjustable clamping pressure extension including a wire set screw threadably engaged with the enclosure top plate, the wire set screw including the pressure end.

\* \* \* \* \*